United States Patent
Kotani et al.

(10) Patent No.: US 12,336,105 B2
(45) Date of Patent: Jun. 17, 2025

(54) COMPONENT MOUNTER

(71) Applicant: FUJI CORPORATION, Chiryu (JP)

(72) Inventors: Kazuya Kotani, Toyota (JP); Keiichi Ono, Anjo (JP); Tomoya Fujimoto, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 516 days.

(21) Appl. No.: 17/775,041

(22) PCT Filed: Nov. 14, 2019

(86) PCT No.: PCT/JP2019/044792
§ 371 (c)(1),
(2) Date: May 6, 2022

(87) PCT Pub. No.: WO2021/095221
PCT Pub. Date: May 20, 2021

(65) Prior Publication Data
US 2022/0400588 A1    Dec. 15, 2022

(51) Int. Cl.
*H05K 13/00* (2006.01)
*H05K 13/02* (2006.01)

(52) U.S. Cl.
CPC ..... *H05K 13/0015* (2013.01); *H05K 13/0076* (2013.01); *H05K 13/022* (2013.01)

(58) Field of Classification Search
CPC ........... H05K 13/0015; H05K 13/0076; H05K 13/022; H05K 13/043; H05K 13/0812
See application file for complete search history.

(56) References Cited

U.S. PATENT DOCUMENTS

| | | | | |
|---|---|---|---|---|
| 6,729,018 | B1* | 5/2004 | Takano | H05K 13/0813 |
| | | | | 29/832 |
| 2002/0073536 | A1* | 6/2002 | Okuda | H05K 13/041 |
| | | | | 29/832 |
| 2010/0122455 | A1* | 5/2010 | Noda | H01L 21/67144 |
| | | | | 29/832 |
| 2022/0400588 | A1* | 12/2022 | Kotani | H05K 13/0812 |

FOREIGN PATENT DOCUMENTS

| | | |
|---|---|---|
| JP | 57-43488 B2 | 9/1982 |
| JP | 2005-159177 A | 6/2005 |
| JP | 2006-93317 A | 4/2006 |
| JP | 2008-311430 A | 12/2008 |
| JP | 2011-114084 A | 6/2011 |
| JP | 2013-243273 A | 12/2013 |

OTHER PUBLICATIONS

International Search Report mailed on Feb. 10, 2020 in PCT/JP2019/044792 filed on Nov. 14, 2019.

* cited by examiner

*Primary Examiner* — Minh N Trinh
(74) *Attorney, Agent, or Firm* — Oblon, McClelland, Maier & Neustadt, L.L.P.

(57) ABSTRACT

A component mounter includes a camera configured to image the supply region, an image processing section configured to execute image processing on image data acquired by imaging of the camera to recognize an accommodation state of the component for each of the multiple cavities and acquire accommodation information in which the accommodation state of the component is associated with a unique address for each of the multiple cavities, and an operation control section configured to execute a collection operation of the component accommodated in the cavity based on the accommodation information.

14 Claims, 11 Drawing Sheets

ACCOMMODATION INFORMATION
(RESULT OF IMAGE PROCESSING)

| No. | ADDRESS | ACCOMMODATION STATE | COORDINATE VALUE OF REFERENCE POSITION |
|---|---|---|---|
| 001 | 0101 | OK | Ps(X1,Y1) |
| 002 | 0102 | OK | Ps(X2,Y2) |
| : | : | : | : |
| 012 | 0112 | OK | Ps(X12,Y12) |
| 013 | 0201 | NG | – |
| 014 | 0202 | OK | Ps(X14,Y14) |
| : | : | : | : |
| 028 | 0304 | OK | Ps(X28,Y28) |
| 029 | 0305 | EMP | – |
| 030 | 0306 | EMP | – |
| 031 | 0307 | OK | Ps(X31,Y31) |
| : | : | : | : |
| 119 | 1011 | NG | – |
| 120 | 1012 | EMP | – |

(OK: COLLECTABLE, NG: NON-COLLECTABLE, EMP: EMPTY)

D1

ACCOMMODATION INFORMATION

D1
(F11)

| ADDRESS |
|---|
| 0101 |
| 0102 |
| : |
| 0112 |
| 0202 |
| : |
| 0304 |
| 0307 |
| : |

ACCOMMODATION INFORMATION

D1
(F12)

| CODE | G12N1G15E2··· |
|---|---|

(G: COLLECTABLE, N: NON-COLLECTABLE, E: EMPTY)

Fig. 8

CAVITY INFORMATION     D2

| No. | ADDRESS | QUALITY STATE | THE NUMBER OF DEFECTS |
|---|---|---|---|
| 001 | 0101 | — | 1st ROW:M01 |
| 002 | 0102 | — | |
| : | : | : | |
| 012 | 0112 | DEFECTIVE | |
| 013 | 0201 | — | 2nd ROW:M02 |
| 014 | 0202 | — | |
| : | : | : | : |
| 028 | 0304 | DEFECTIVE | |
| 029 | 0305 | — | |
| 030 | 0306 | — | |
| 031 | 0307 | — | |
| : | : | : | : |
| 119 | 1011 | — | 12th ROW:M12 |
| 120 | 1012 | — | |

NUMBER Ms OF DEFECTIVE CAVITIES=M01+M02+ ··· +M12

COMPONENT MOUNTER

TECHNICAL FIELD

The present disclosure relates to a component mounter.

BACKGROUND ART

A component mounter executes a mounting process of mounting components supplied by a bulk feeder or the like on a board. The bulk feeder is used to supply the components accommodated in a bulk state. As shown in Patent Literature 1, there is a type of bulk feeder in which the components are supplied in the bulk state in which the components are scattered in a supply region in which the components can be collected by a suction nozzle. In a mounting process, the component mounter executes image processing of recognizing a supply state of the components by the bulk feeder, and controls a suction operation of the components using the suction nozzle based on a result of the image processing.

PATENT LITERATURE

Patent Literature 1: JP-A-2011-114084

BRIEF SUMMARY

Technical Problem

Here, result information of the image processing by the component mounter includes a position and an angle of the components that can be collected in the supply region. Therefore, there is a risk that, as the number of components that can be collected is increased, the amount of result information of the image processing is increased, and as a result, the subsequent usability or manageability is decreased. It is considered that this is because the position or the number of the components that can be collected among multiple components supplied in the supply region of the bulk feeder is changed greatly with each supplying process.

The present description is to supply a component mounter that corresponds to a bulk feeder having a structure of being capable of supplying components more efficiently and stably, and can improve usability and manageability of result information of image processing of recognizing the components that can be collected.

Solution to Problem

The present description discloses a component mounter configured to mount supplied components on a board by a bulk feeder, in which the bulk feeder includes multiple cavities individually accommodating multiple components in a supply region in which the component mounter is configured to collect the components, and an accommodation device configured to accommodate the multiple components discharged from a component case accommodating the multiple components in a bulk state in at least a part of the cavities, the component mounter including a camera configured to image the supply region, an image processing section configured to execute image processing on image data acquired by imaging of the camera to recognize an accommodation state of the component for each of the multiple cavities and acquire accommodation information in which the accommodation state of the component is associated with a unique address for each of the multiple cavities, and an operation control section configured to execute a collection operation of the component accommodated in the cavity based on the accommodation information.

Advantageous Effects

With such a configuration, efficient supplying of the components is used by the bulk feeder aligning the components in multiple cavities. That is, the component mounter can collect the components accommodated in multiple cavities in the supply region, so that the address corresponding to multiple cavities and the accommodation state associated with the address can be used as the result information of the image processing. Therefore, it is possible to improve the usability and the manageability of the result information of the image processing of recognizing the components that can be collected.

BRIEF DESCRIPTION OF DRAWINGS

FIG. 8 is a view showing cavity information.

DESCRIPTION OF EMBODIMENTS

1. Configuration of Component Mounter 10

Component mounter 10 configures a production line for producing a board product together with multiple types of board work machines including, for example, another component mounter 10. The board work machine configuring the production line described above can include a printer, an inspection device, a reflow furnace, or the like.

1-1. Board Conveyance Device

Figure 1:
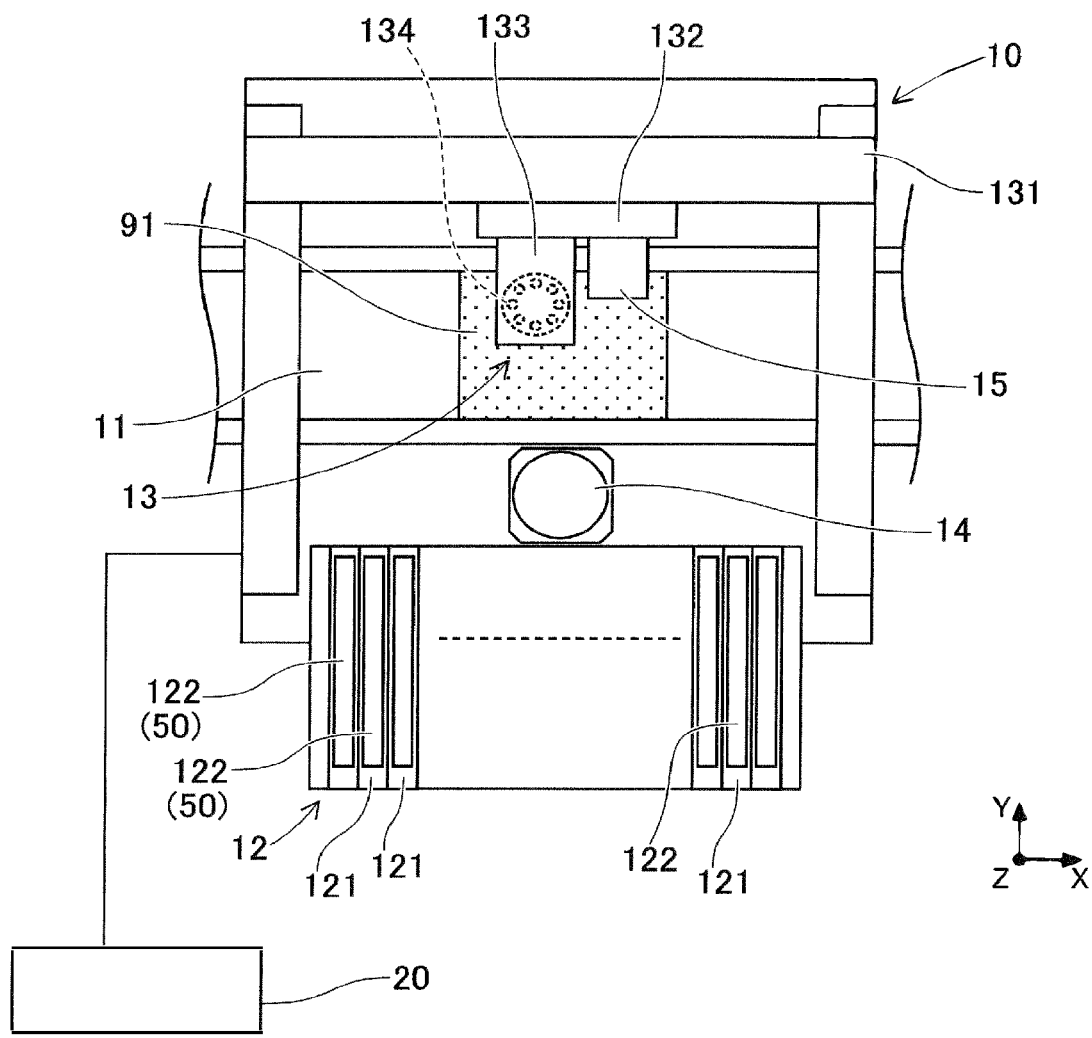
FIG. 1 is a schematic view showing a configuration of a component mounter.

As shown in FIG. 1, component mounter 10 includes board conveyance device 11. Board conveyance device 11 sequentially conveys board 91 in a conveyance direction, and positions board 91 at a predetermined position in the machine.

1-2. Component Supply Device 12

Component mounter 10 includes component supply device 12. Component supply device 12 supplies components to be mounted on board 91. Component supply device 12 is equipped with feeder 122 in each of multiple slots 121. A tape feeder that supplies the components to be collectable, for example, by feeding and moving a carrier tape accommodating multiple components is applied to feeder 122. In addition, bulk feeder 50 that supplies the components accommodated in a bulk state (in a loose state in which each posture is irregular) to be collectable is applied to feeder 122. Details of bulk feeder 50 will be described below.

1-3. Component Transfer Device 13

Component mounter 10 includes component transfer device 13. Component transfer device 13 transfers the components supplied by component supply device 12 to a predetermined mounting position on board 91. Component transfer device 13 includes head driving device 131, moving table 132, mounting head 133, and suction nozzle 134. Head driving device 131 moves moving table 132 in a horizontal direction (X-direction and Y-direction) by a linear motion mechanism. Mounting head 133 is detachably fixed to moving table 132 by a clamp member (not shown), and is provided to be movable in the horizontal direction in the machine.

Mounting head 133 supports multiple suction nozzles 134 to be rotated and raised and lowered. Suction nozzle 134 is a holding member that collects and holds component 92 supplied by feeder 122. Suction nozzle 134 picks up the components supplied by feeder 122 by supplied negative pressure air. As the holding member attached to mounting head 133, a chuck or the like that holds the components by gripping the components can be adopted.

Here, as mounting head 133 described above, various types can be adopted. Specifically, as mounting head 133, there is a type in which multiple holding members are supported by a rotary head provided to be rotatable around an R-axis parallel to a vertical axis (Z-axis). In the present embodiment, mounting head 133 supports 24 suction nozzles 134 by the rotary head. In addition, as mounting head 133, there are a type in which the multiple holding members arranged linearly or in a matrix are supported, a type in which one holding member is supported, and the like. The type of mounting head 133 can be appropriately selected depending on, for example, a type of board product to be produced.

1-4. Part Camera 14 and Board Camera 15

Component mounter 10 includes part camera 14 and board camera 15. Part camera 14 and board camera 15 are digital imaging devices having imaging elements, such as a CMOS. Part camera 14 and board camera 15 execute imaging based on control signals and send image data acquired by the imaging. Part camera 14 is configured to image the components held by suction nozzle 134 from below. Board camera 15 is provided on moving table 132 to be movable in the horizontal direction integrally with mounting head 133. Board camera 15 is configured to image board 91 from above.

In addition to using a surface of board 91 as an imaging target, board camera 15 can use various devices and the like as the imaging target as long as various devices are within a movable range of moving table 132. For example, in the present embodiment, board camera 15 can image supply region As (see FIG. 3) to which bulk feeder 50 supplies components 92. As described above, board camera 15 can be used for imaging different imaging targets to acquire the image data used for various pieces of image processing.

1-5. Control Device 20

Figure 5:
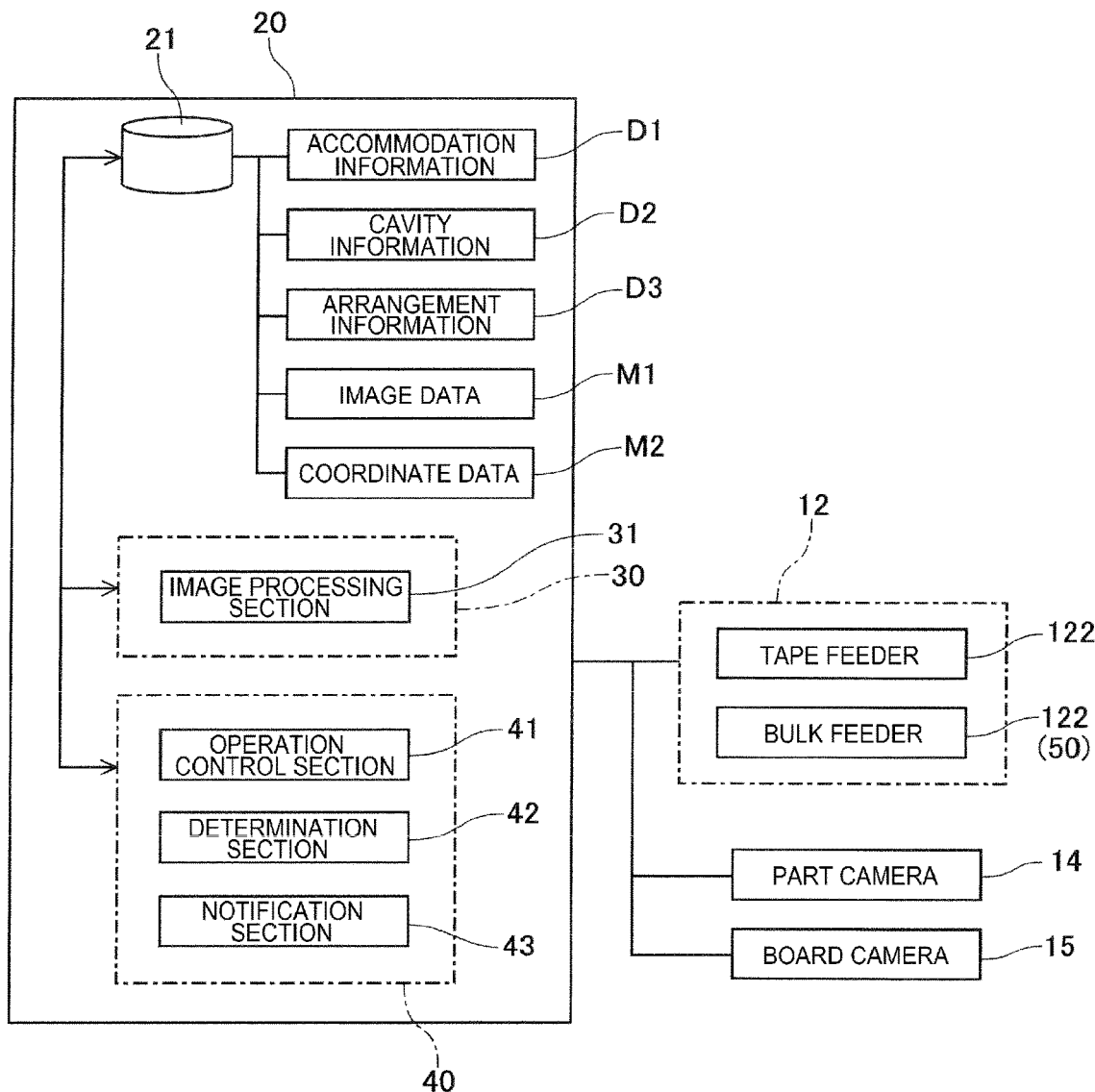
FIG. 5 is a block diagram showing a control device of the component mounter.

Component mounter 10 includes control device 20. Control device 20 is mainly composed of CPU, various memories, or a control circuit. Control device 20 includes storage section 21 as shown in FIG. 5. Storage section 21 is composed of an optical drive device, such as a hard disk device or a flash memory. Storage section 21 of control device 20 stores various data, such as a control program used for controlling a mounting process. The control program indicates the mounting position and a mounting order of the components mounted on board 91 in the mounting process.

Control device 20 executes recognition processing of a holding state of the component held by each of multiple holding members (suction nozzles 134). Specifically, control device 20 executes the image processing on the image data acquired by the imaging of part camera 14 and recognizes a position and an angle of each component with respect to a reference position of mounting head 133. It should be noted that, in addition to part camera 14, control device 20 may execute the image processing on the image data acquired by imaging the components by a head camera unit or the like provided integrally with mounting head 133 from side, below, or above.

Control device 20 controls a mounting operation of the components by mounting head 133 based on the control program to execute the mounting process. Here, the mounting process includes a process of repeating a pick-and-place cycle (hereinafter, referred to as "PP cycle") including a collection operation and the mounting operation multiple times. The "collection operation" described above is an operation of collecting the components supplied by component supply device 12 by suction nozzle 134.

In the present embodiment, in a case where the collection operation described above is executed, control device 20 controls the operation of component supply device 12 including bulk feeder 50 and executes recognition processing of a supply state of components 92 in supply region As of bulk feeder 50. The "recognition processing of the supply state" described above includes processing of recognizing whether components 92 that can be collected are present in supply region As, and recognizing the positions of components 92 in a case where components 92 are present, as needed. Moreover, control device 20 controls an operation of mounting head 133 in the collection operation based on a result of the recognition processing of the supply state.

In addition, the "mounting operation" described above is an operation of mounting the collected components at the predetermined mounting position on board 91. In the mounting process, control device 20 controls the operation of mounting head 133 based on information output from various sensors, the result of image processing, a control program, or the like. As a result, the positions and the angles of multiple suction nozzles 134 supported by mounting head 133 are controlled. The detailed configuration of control device 20 will be described below.

2. Configuration of Bulk Feeder 50

Bulk feeder 50 is installed on component mounter 10 and functions as at least a part of component supply device 12. Since, unlike the tape feeder, bulk feeder 50 does not use the carrier tape, there is an advantage in that loading of the carrier tape, collection of used tape, or the like can be omitted. On the other hand, since bulk feeder 50 supplies components 92 accommodated in the bulk state which are not aligned like the carrier tape, the supply state of components 92 can affect the collection operation by the holding member, such as suction nozzle 134.

Specifically, in a case where components 92 are close enough to be in contact with each other or are deposited (state of overlapping in the up-down direction) in supply region As, components 92 cannot be used as a collection target. In addition, in a case where components 92 are supplied to supply region As in an irregular posture, the image processing of recognizing the supply state (whether components 92 can be collected and posture of components 92 that can be collected) is required. Therefore, it is desired that bulk feeder 50 be in a state of being supplied with multiple components 92 that can be collected in supply region As without being insufficient in the required number, and is further appropriately dispersed. Therefore, bulk feeder 50 of the present embodiment adopts a configuration in which components 92 are aligned in supply region As.

2-1. Feeder Main Body 51

Figure 2:
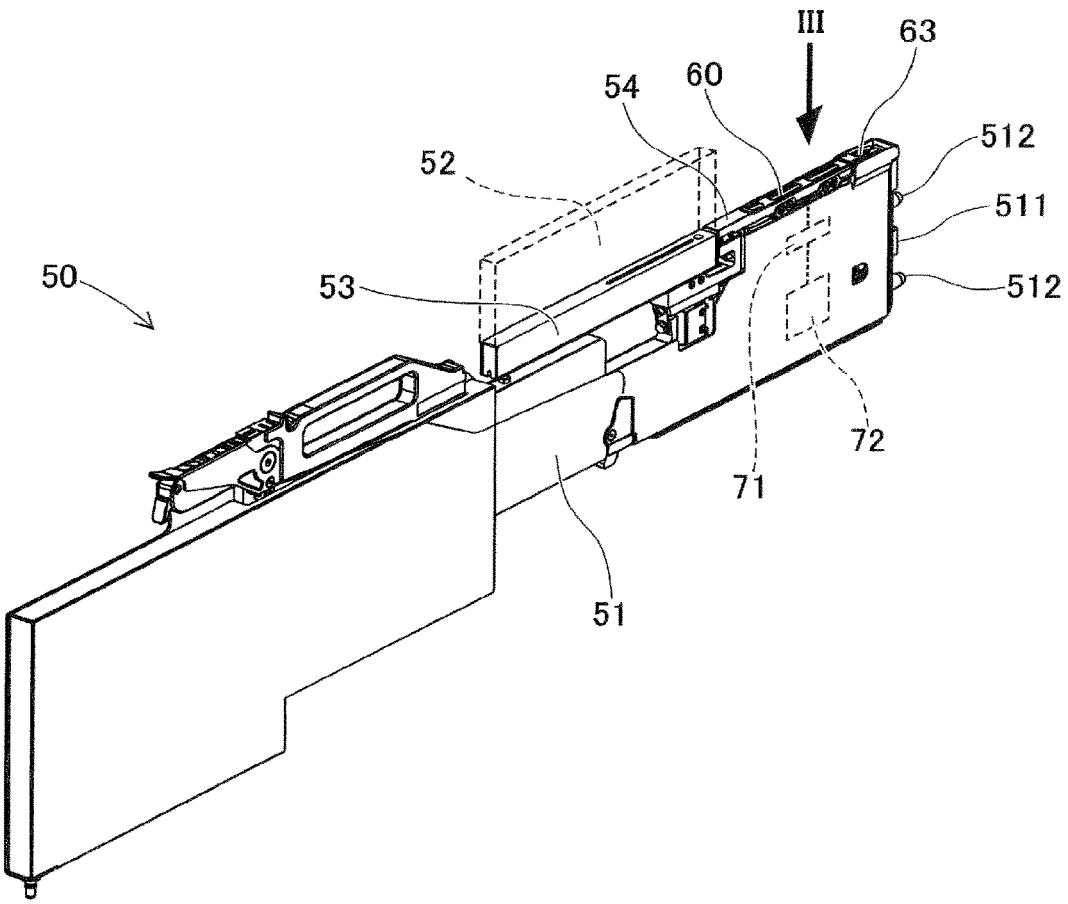
FIG. 2 is a perspective view showing an appearance of a bulk feeder.

As shown in FIG. 2, bulk feeder 50 includes feeder main body 51. Feeder main body 51 is formed in a flat box shape. Feeder main body 51 is set in slot 121 of component supply device 12. Connector 511 and two pins 512 are formed on a front part of feeder main body 51. In a case where bulk feeder 50 is set in slot 121, connector 511 is communicably connected to a main body side of component mounter 10. In addition, bulk feeder 50 is supplied with power via connector 511. Two pins 512 are used for positioning in a case where feeder main body 51 is set in slot 121.

2-2. Component Case 52, Discharge Device 53, and Cover 54

In the present embodiment, component case 52 accommodating multiple components 92 in the bulk state is detachably attached to feeder main body 51. Component case 52 is configured to discharge components 92 to the outside. In the present embodiment, component case 52 is an external device of bulk feeder 50, for example, one of various types suitable for the mounting process is selected and attached to feeder main body 51.

Bulk feeder 50 includes discharge device 53. Discharge device 53 adjusts the number of components 92 to be discharged from component case 52. Discharge device 53 supplies multiple components 92 discharged from component case 52 to reception region Ar of track member 60, which will be described below. Bulk feeder 50 includes cover 54. Cover 54 is detachably attached to a front upper part of feeder main body 51. Cover 54 prevents components 92 conveyed along conveyance path R of track member 60, which will be described below, from scattering to the outside. Pair of right and left circular reference marks 55 indicating the reference position of bulk feeder 50 are attached to an upper face of cover 54.

2-3. Track Member 60

Figure 3:
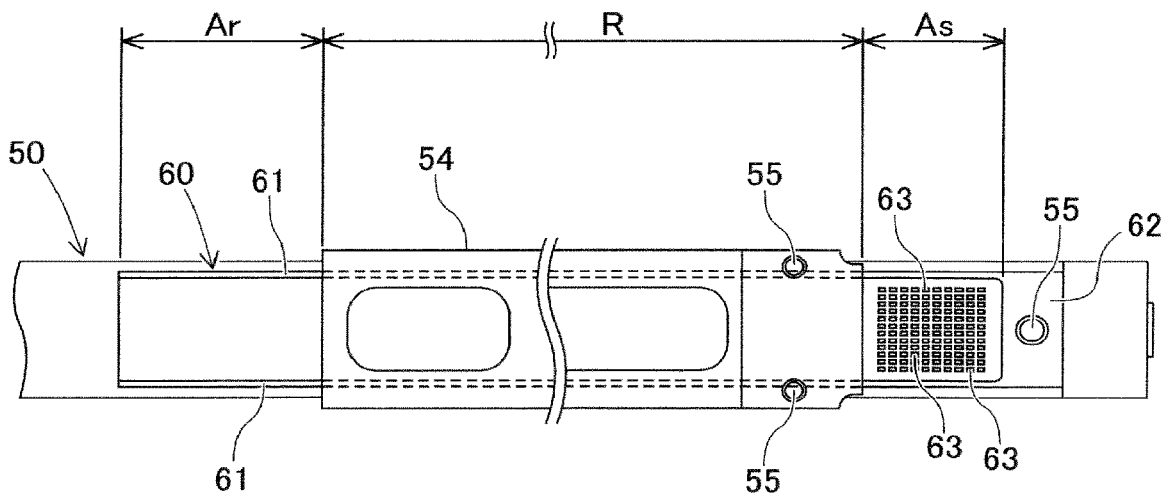
FIG. 3 is a plan view seen from a direction III of FIG. 2.

Bulk feeder 50 includes track member 60. Track member 60 is provided on the front upper part of feeder main body 51. As shown in FIG. 3, track member 60 is formed to extend in a front-rear direction (right-left direction of FIG. 3) of feeder main body 51. Pair of side walls 61 protruding upward are formed on both edges of track member 60 in the width direction (up-down direction in FIG. 3). Pair of side walls 61 surround the peripheral edge of conveyance path R together with distal end portion 62 of track member 60 to prevent leakage of components 92 conveyed along conveyance path R. Circular reference mark 55 indicating the reference position of bulk feeder 50 is attached to an upper face of distal end portion 62.

Track member 60 having the configuration described above has reception region Ar, supply region As, and conveyance path R. Here, "reception region Ar" is a region in which components 92 in the bulk state, which are discharged from component case 52, are received. Reception region Ar of the present embodiment is positioned below a discharge port of component case 52. In addition, "supply region As" is a region to which components 92 are supplied. In other words, "supply region As" is a region in which components 92 can be collected by suction nozzle 134 supported by mounting head 133, and is included in the movable range of mounting head 133.

In addition, "conveyance path R" of track member 60 is a path of components 92 from reception region Ar to supply region As. In the present embodiment, conveyance path R is formed in a groove shape in which a groove bottom face is horizontal. A groove side face of conveyance path R is formed by pair of side walls 61. A groove opening on an upper side of conveyance path R is largely closed by cover 54. Track member 60 is supported to be slightly displaceable (that is, can vibrate) with respect to feeder main body 51 in a virtual vertical plane formed in the front-rear direction and the up-down direction.

Track member 60 has a mechanism that aligns multiple components 92. Specifically, track member 60 has multiple cavities 63 that individually accommodate multiple components 92 in supply region As in which component mounter 10 can collect components 92. Specifically, multiple cavities 63 are arranged in a matrix in supply region As. For example, track member 60 has 120 cavities 63 in total in which 10 cavities are regularly arranged in the conveyance direction and 12 cavities are regularly arranged in the width direction of conveyance path R.

In addition, each of multiple cavities 63 opens on an upper face of conveyance path R, and accommodates component 92 in a posture in which a thickness direction of component 92 is the up-down direction. The opening of cavity 63 is set to a size slightly larger than an outer shape of component 92 in an upward view. The depth of cavity 63 is appropriately set in accordance with the type (shape, mass, or the like) of component 92. In a case where it is assumed that components 92 are accommodated in the carrier tape and supplied by the tape feeder, the shape of cavity 63 is similar to the shape of the cavity formed in the carrier tape. In addition, the number of cavities 63 in track member 60 is appropriately set in consideration of the shape, the required number, and the degree of density of cavities 63, which can affect the conveyance property.

In addition, it is preferable that the number of cavities 63 in track member 60 be set to be larger than the maximum number of components 92 collected by the collection operation in one PP cycle. It should be noted that the "maximum number" described above corresponds to the number of suction nozzles 134 supported by mounting head 133. In the present embodiment, since mounting head 133 supports 24 suction nozzles 134, the number of cavities 63 is set to be more than at least 24.

Here, a configuration may be adopted in which multiple cavities 63 are formed in an attachment member (hereinafter, "alignment member") that is attached to track member 60 to be exchangeable. Specifically, in a case of setting up bulk feeder 50, for example, multiple types of alignment members corresponding to various aspects are prepared to be exchangeable. Moreover, in bulk feeder 50, one selected from multiple types of alignment members having different shapes from each other corresponding to the types of components 92 to be supplied is attached to track member 60.

Further, a configuration may be adopted track member 60 of bulk feeder 50 is attached to feeder main body 51 to be exchangeable. In this case, multiple cavities 63 may be formed integrally with track member 60, or may be formed in the alignment member described above to be exchangeable. Specifically, in a case of setting up bulk feeder 50, for example, multiple types of track members 60 in which multiple types of cavities 63 corresponding to various aspects are formed are prepared to be exchangeable.

Moreover, in bulk feeder 50, one selected from multiple types of track members 60 is attached to feeder main body 51. With such a configuration, bulk feeder 50 can share feeder main body 51 or vibration device 71 described below, and can handle the types or the supply aspects of components 92 by exchanging alignment member in which multiple cavities 63 are formed or track member 60. As a result, a range of use of bulk feeder 50 can be enlarged, and a production cost of the board product can be reduced.

2-4. Vibration Device 71 (Accommodation Device)

Bulk feeder 50 includes vibration device 71. Vibration device 71 is provided on feeder main body 51. Vibration device 71 applies the vibration to track member 60 such that components 92 on conveyance path R are conveyed. As a result, vibration device 71 causes track member 60 to execute clockwise or counterclockwise elliptical movement in the horizontal direction orthogonal to the conveyance direction of components 92 in conveyance path R. In this case, vibration device 71 causes track member 60 to vibrate such that external force directed forward or rearward and upward is applied to components 92 on conveyance path R.

Vibration device 71 is composed of, for example, a support member that connects feeder main body 51 and track member 60, a piezoelectric element attached to the support member, and a driving section that supplies power to the piezoelectric element. Driving section changes the frequency of the power supplied to the piezoelectric element and the applied voltage based on a command of feeder control device 72, which will be described below. As a result, the frequency and the amplitude of the vibration applied to track member 60 are adjusted, and a rotation direction of the elliptical movement of track member 60 is determined. In a case where the frequency or the amplitude of the vibration of track member 60 and the rotation direction of the elliptical movement due to the vibration are changed, a conveyance speed of components 92 to be conveyed, a degree of dispersion of components 92, the conveyance direction, and the like are changed.

With the configuration described above, vibration device 71 applies predetermined vibration to track member 60, and multiple components 92 discharged from component case 52 to reception region Ar of track member 60 can be conveyed to supply region As via conveyance path R. In addition, with the configuration described above, even in a case where many components 92 are supplied to conveyance path R to be close to each other and deposited, the external force in the conveyance direction can be applied to component group Gp (see FIG. 4). As a result, track member 60 and vibration device 71 can convey component group Gp as a whole. It should be noted that, the "component group" described above is a set of multiple components 92 in the bulk state.

In the following, an operation of vibration device 71 of conveying components 92 on conveyance path R in a direction toward supply region As is referred to as a "feeding operation". In addition, an operation of vibration device 71 of conveying components 92 on conveyance path R in a direction toward reception region Ar is referred to as a "returning operation". It should be noted that the elliptical movement of track member becomes reverse rotation by switching between the feeding operation and the returning operation of vibration device 71. With the configuration described above, vibration device 71 functions as the accommodation device which accommodates multiple components 92 discharged from component case 52 in at least a part of cavities 63.

2-5. Feeder Control Device 72

Bulk feeder 50 includes feeder control device 72. Feeder control device 72 is mainly composed of CPU, various memories, or a control circuit. Feeder control device 72 is supplied with the power via connector 511 in a state in which bulk feeder 50 is set in slot 121, and is in a state of being capable of communicating with component mounter 10 and control device 20. Feeder control device 72 controls the operation of vibration device 71 in a component supplying process to supply region As, and executes the feeding operation and the returning operation described above.

Specifically, feeder control device 72 sends a command to driving section of vibration device 71 in a case of executing the feeding operation. As a result, by driving section supplying predetermined power to the piezoelectric element, the vibration is applied to track member 60 via the support member. As a result, components 92 on conveyance path R are conveyed by receiving the external force to move to the front side in the conveyance direction.

In addition, feeder control device 72 realizes various conveyance aspects by combining the execution time of the feeding operation and the returning operation of vibration device 71, or the like. For example, feeder control device 72 continues the feeding operation until component group Gp reaches the vicinity of distal end portion 62 of track member 60 (see the middle stage of FIG. 4) after at least a part of multiple components 92 on conveyance path R reaches supply region As (see the upper stage of FIG. 4). In this case, the returning operation and the feeding operation may be further repeatedly executed to retain multiple components 92 in supply region As in a state in which track member 60 vibrates.

Figure 4:
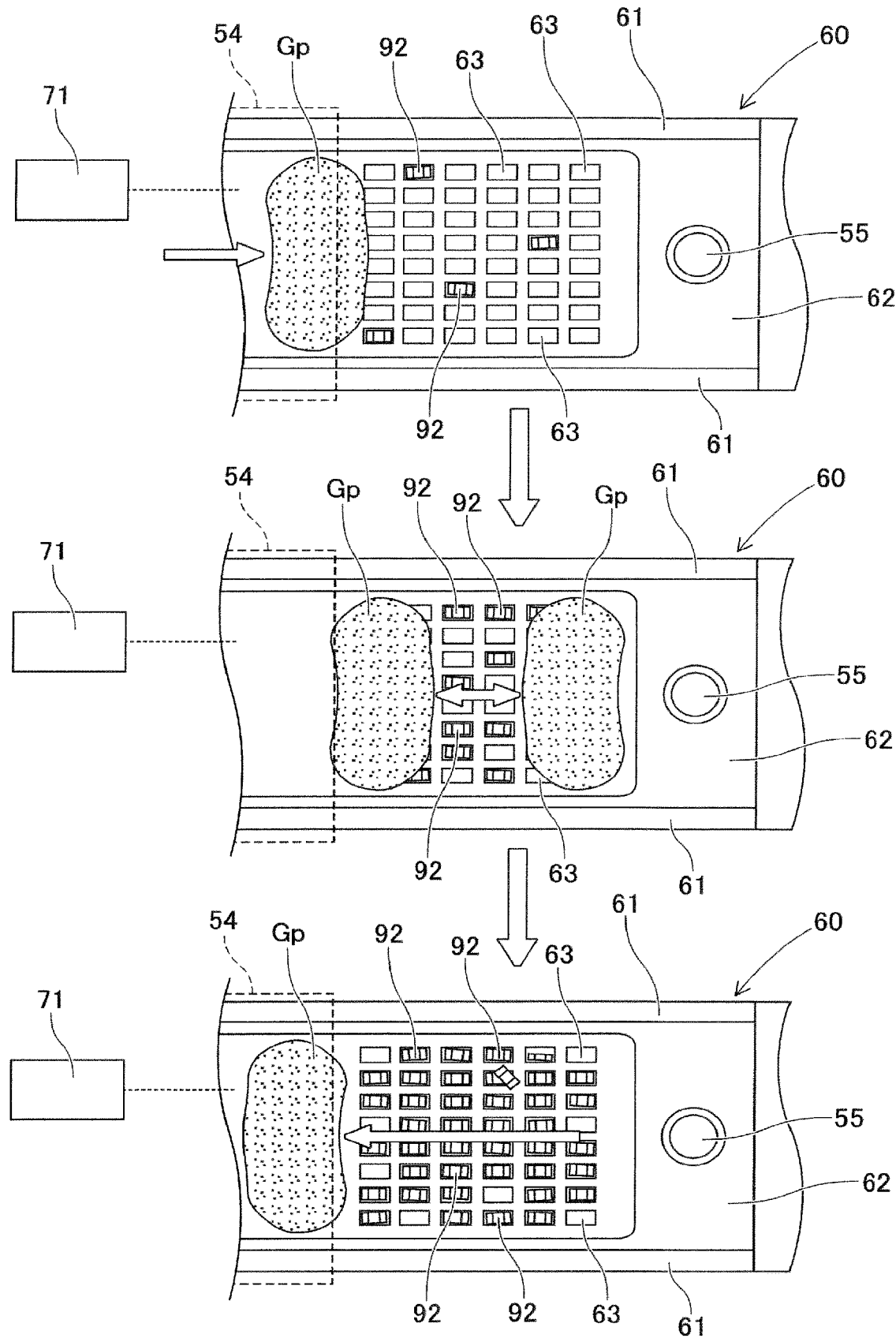
FIG. 4 is a view showing the transition of an accommodation state of components by a component supplying process.

Thereafter, feeder control device 72 retracts remaining component group Gp from supply region As toward reception region Ar by executing the returning operation in a state in which at least a part of multiple components 92 on conveyance path R is accommodated in multiple cavities 63 (see the lower stage of FIG. 4). As a result, components 92 are appropriately accommodated in a predetermined number or more of multiple cavities 63. Feeder control device 72 can appropriately set the execution time of the feeding operation or the returning operation, the time of the retention operation in the accommodation step, or the number of executions of the repetitive operation. In addition, feeder control device 72 may adjust at least one of the frequency and the amplitude of the vibration applied to track member 60 by vibration device 71 in accordance with the type of components 92 accommodated in component case 52.

3. Detailed Configuration of Control Device 20 of Component Mounter 10

A detailed configuration of control device 20 of component mounter 10 will be described with reference to FIGS. 5 to 9. In the present embodiment, control device 20 includes storage section 21, image processing unit 30, and mounting control unit 40, which are connected to each other to be communicable with each other, as shown in FIG. 5.

Storage section 21 stores accommodation information D1, cavity information D2, and arrangement information D3 of cavities 63. Further, storage section 21 stores image data M1 acquired by imaging of part camera 14 or board camera 15, and coordinate data M2 indicating a coordinate value for each of multiple cavities 63 in the machine. Details of various information D1 to D3 and various data M1 and M2 will be described below.

3-1. Image Processing Unit 30

Image processing unit 30 is a unit composed of an interface that inputs and outputs image data or a processing result, CPU that executes the image processing, or various circuits. For example, image processing unit 30 inputs an imaging command to input image data from part camera 14 that executes an imaging process, and executes predetermined image processing set in advance. As a result, whether component 92 is held by each of multiple suction nozzles 134, and the posture of component 92 with respect to mounting head 133, in a case where component 92 is held, are recognized. Image processing unit 30 stores the results of various image processing in storage section 21 or sends the results of various image processing to mounting control unit 40 by communication.

3-1-1. Image Processing Section 31

Control device 20 includes image processing section 31 provided in image processing unit 30 in the present embodiment. Image processing section 31 executes the image processing on image data M1 acquired by the imaging of board camera 15, recognizes the accommodation state of component 92 for each of multiple cavities 63, and acquires accommodation information D1 in which the accommodation state of component 92 is associated with a unique address for each of multiple cavities 63.

Figure 6:
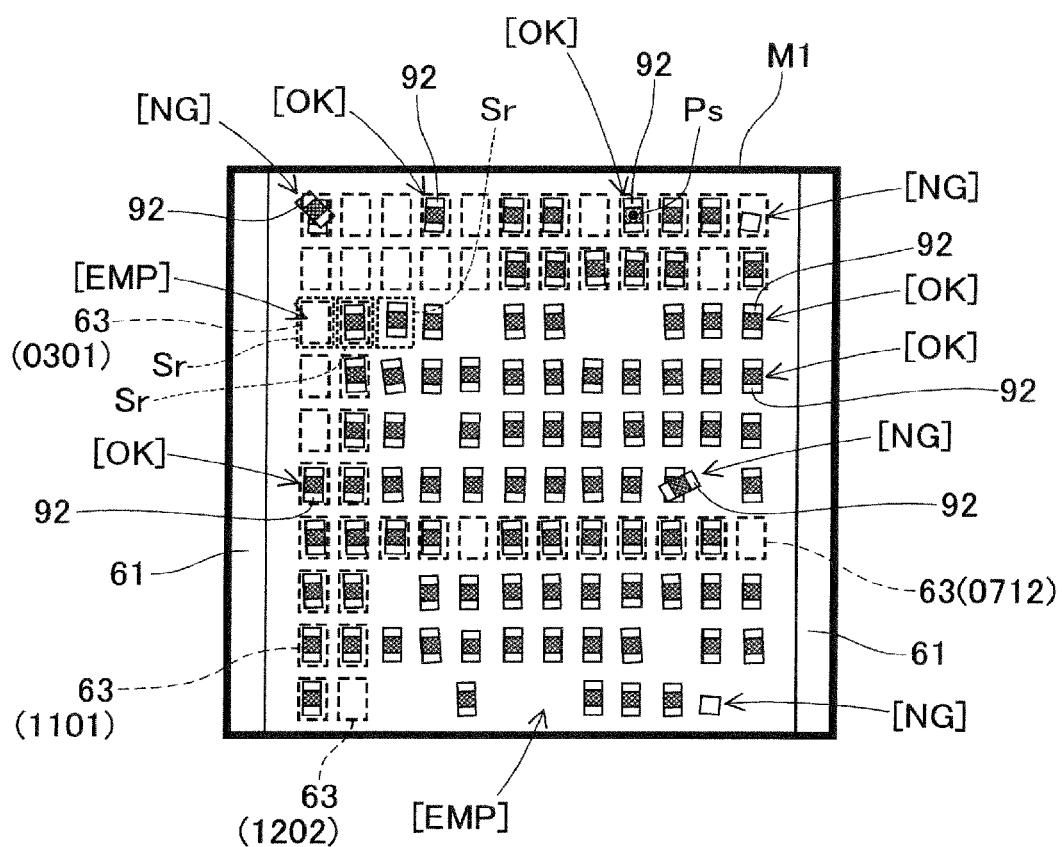
FIG. 6 is a view showing image data used for recognition processing of a supply state of the components in a supply region.

Here, FIG. 6 shows a part of multiple cavities 63 with a broken line. Multiple cavities 63 are regularly arranged in a matrix as described above, and each of multiple cavities 63 has the unique address. In the present embodiment, multiple addresses have consecutiveness relating to the arrangement of multiple cavities 63. Specifically, the multiple addresses may be simply a numerical value from "001" to "120", or may be a combination of a numerical value from "01" to "10" indicating the number of rows and a numerical value from "01" to "12" indicating the number of columns (for example, "0712" in a case of the seventh row and twelfth column). In addition, the multiple addresses may be indicated by a character string or the like in addition to the numerical value as long as it is unique information associated with multiple cavities 63 on a one-to-one basis.

Here, image processing section 31 executes recognition processing of recognizing the supply state of component 92 in supply region As after the component supplying process by bulk feeder 50 is executed. Specifically, image processing unit 30 first moves board camera 15 above supply region As of bulk feeder 50, and acquires image data M1 by imaging of board camera 15. Moreover, as shown in FIG. 6, image processing section 31 executes predetermined image processing on image data M1 and recognizes components 92 accommodated in multiple cavities 63, respectively.

Specifically, image processing section 31 determines whether image data M1 can be collected based on the positions of multiple cavities 63 indicated by coordinate data M2 and the postures of components 92 in image data M1 subjected to the image processing. Specifically, image processing section 31 determines that component 92 appropriately accommodated in cavity 63 can be collected ("OK" in FIG. 6). Image processing section 31 determines that components 92 accommodated in an inappropriate posture, such as a tilted posture, in cavities 63 or multiple components 92 in a state of being accumulated on each other cannot be collected ("NG" in FIG. 6). In addition, image processing section 31 determines that it is an empty state in a case where component 92 is not present in the vicinity of cavity 63 ("EMP" in FIG. 6).

Figure 7:
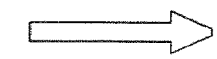
FIG. 7 is a view showing accommodation information acquired by the image processing.

Subsequently, image processing section 31 associates the accommodation state (determination result described above) of cavity 63 corresponding to each of the multiple addresses. As a result, image processing section 31 acquires accommodation information D1 as shown in FIG. 7. Specifically, accommodation information D1 indicates the accommodation state (OK/NG/EMP) associated with the address (0101, 0102, . . . , 1012). Here, in the image processing, image processing section 31 recognizes the accommodation state of component 92 for each of multiple cavities 63 and calculates coordinate value Ps of a reference position of the collectable component accommodated in cavity 63 in a normal posture among multiple components 92.

The "reference position" described above of the components that can be collected is a position arbitrarily set on the upper face of component 92, and is set to, for example, a center, a centroid, or a flat region of component 92 suitable for pick-up by suction nozzle 134 in a case where suction nozzle 134 is used for the collection operation. In the image processing, image processing section 31 calculates coordinate value Ps of the reference position in the component that can be collected by recognizing, for example, the outer shape, or the center position of the component that can be collected. Moreover, image processing section 31 associates coordinate value Ps of the reference position with the address.

As a result, as shown in FIG. 7, image processing section 31 acquires accommodation information D1 in which coordinate value Ps of the reference position is associated with the address having the accommodation state of "OK" among the multiple addresses. Image processing section 31 calculates coordinate value Ps of the reference position as described above as needed. For example, in the image processing, image processing section 31 may switch whether to calculate coordinate value Ps of the reference position in component 92 in accordance with the type of component 92. Specifically, image processing section 31 calculates coordinate value Ps of the reference position in a case where component 92 is smaller than a predetermined size.

This is because even in a case where component 92 is accommodated in cavity 63 in the normal posture, the influence of the deviation amount of the reference position with respect to the center of cavity 63 on the collection operation is more remarkable as the component size is smaller. From the same viewpoint, image processing section 31 may switch whether to calculate coordinate value Ps of the reference position of component 92 in the image processing in accordance with a difference in sizes of cavity 63 and component 92, the shape of cavity 63, and the accuracy required for the mounting process.

3-1-2. Various Aspects of Accommodation Information D1

In addition, image processing section 31 may process accommodation information D1 by a first aspect or a second aspect in order to reduce the load of various processes after accommodation information D1 is used, reduce the load of communication between image processing unit 30 and mounting control unit 40, reduce the data capacity in storage section 21, or the like. Specifically, in the first aspect, image processing section 31 acquires accommodation information D1 (F11) in which the accommodation state is associated only with the address of cavity 63 in the collectable state in which component 92 is accommodated in cavity 63 in the normal posture in the result of the image processing (accommodation information D1 of FIG. 7), and transmits accommodation information D1 (F11) to operation control section 41.

With such a configuration, information not used in the collection operation (address of cavity 63 of NG or EMP) is omitted in accommodation information D1 (F11). As a result, it is possible to reduce the load of the processes after the address is used whose accommodation state is "OK", and it is also possible to reduce the load of communication between the units. Further, it is possible to reduce the data capacity of accommodation information D1 (F11).

In the second aspect, image processing section 31 acquires accommodation information D1 (F12) in which the accommodation state associated with each consecutive address is encoded by run-length compression, and transmits accommodation information D1 (F12) to operation control section 41. Specifically, image processing section 31 uses consecutiveness of multiple addresses relating to the arrangement of multiple cavities 63. Moreover, in a case where the same accommodation state (OK/NG/EMP) is associated with the consecutive addresses, image processing section 31 compress accommodation information D1 by a character (G/N/E) indicating the accommodation state and a numerical value indicating the consecutive numbers.

Specifically, as shown in accommodation information D1 (F12) of FIG. 7, in a case where there are 12 consecutive accommodation states "OK", 1 accommodation state "NG", 15 consecutive accommodation states "OK", and 2 accommodation states "EMP", the information is encoded as "G12N1G15E2 . . . ". With such a configuration, accommodation information D1 (F12) can indicate the accommodation states of all cavities 63, and the load of the subsequent processes can be reduced. In addition, the data capacity of accommodation information D1 (F12) can be reduced, and the load of communication between the units can be reduced.

3-1-3. Target Range of Image Processing

Based on arrangement information D3, image processing section 31 may set a target range of the image processing only within defined range Sr for each of multiple cavities 63. Here, arrangement information D3 described above is information indicating the positions of multiple cavities 63 in bulk feeder 50. Specifically, items, such as the shape, the number of rows and columns of the arrangement, the orientation, and the depth of multiple cavities 63, can be appropriately added to arrangement information D3. It should be noted that arrangement information D3 may be acquired from feeder control device 72 of bulk feeder 50 by communication, or may be acquired from a host device and the like in accordance with the type of track member 60 identified based on the image data acquired by imaging supply region As.

Image processing section 31 sets the target range of the image processing only within defined range Sr in which a predetermined range is appropriately added to the range occupied by multiple cavities 63 recognized based on arrangement information D3 in image data M1, as described above. As a result, the load of the image processing can be reduced as compared with the configuration in which the entire region of image data M1 is the target range of the image processing. It should be noted that image processing section 31 may, for example, set supply region As as the target range of the image processing or may set one rectangular region including entire multiple cavities 63 as the target range of the image processing in accordance with the area of supply region As occupied by multiple cavities 63.

3-2. Mounting Control Unit 40

Mounting control unit 40 is a unit composed of an interface that inputs and outputs various data or detection signals from various sensors, CPU that executes the mounting process, or various circuits. Mounting control unit 40 inputs accommodation information D1 as the result of the image processing from image processing section 31, and executes the mounting process based on accommodation information D1.

3-2-1. Operation Control Section 41

Control device 20 includes operation control section 41 provided in mounting control unit 40 in the present embodiment. Operation control section 41 executes the collection operation of component 92 accommodated in cavity 63 based on accommodation information D1. Operation control section 41 uses component 92 indicated as the collectable state, in accommodation information D1, in which component 92 is accommodated in cavity 63 in the normal posture, as a target of the collection operation. Specifically, operation control section 41 extracts the required number of components 92 to be collected by the collection operation in the current PP cycle from the address of the accommodation state "OK" included in accommodation information D1.

In a case where the number of collectable components 92 in accommodation information D1 exceeds the required number, operation control section 41 extracts the multiple addresses such that the required time for the multiple collection operations is shortened. Specifically, operation control section 41 may preferentially extract consecutive addresses, or preferentially extract addresses of cavities 63 close to board 91, which is a mounting target. Moreover, operation control section 41 executes the collection operation by using component 92 as a target from cavity 63 corresponding to the required number of extracted addresses.

In this case, operation control section 41 converts each of the multiple addresses into coordinate values based on coordinate data M2, and positions suction nozzle 134 at the coordinate values. In other words, operation control section 41 positions suction nozzle 134 at the coordinate value which is the center of cavity 63 corresponding to the multiple addresses. In addition, in a case where accommodation information D1 indicates coordinate value Ps of the reference position in component 92, operation control section 41 may execute the collection operation based on the accommodation state of component 92 and coordinate value Ps of the reference position. Operation control section 41 may switch whether to position suction nozzle 134 to any position in accordance with the accuracy required for the mounting process.

3-2-2. Determination Section 42

Control device 20 includes determination section 42 provided in mounting control unit 40 in the present embodiment. Determination section 42 determines the quality of cavity 63 accommodating component 92 based on the operation result of whether component 92 is collected after the collection operation is executed. The operation result described above is, for example, the result of the recognition processing of the holding state of component 92 executed after the collection operation. In the recognition processing of the holding state, it is determined whether component 92 is held by suction nozzle 134.

Here, in the collection operation, in a case where a collection error in which component 92 is not held occurs even though the collection of component 92 is attempted from cavity 63 in which component 92 is normally accommodated, although component 92 is apparently normally accommodated in cavity 63, it is assumed that component 92 is actually stuck in cavity 63. Therefore, in a case where component 92 is not collected, determination section 42 determines that cavity 63 accommodating component 92 is defective and records the determination result in cavity information D2. As shown in FIG. 8, cavity information D2 described above is information in which the determination result by determination section 42 is associated with the address.

It should be noted that, as the cause of the collection error described above, in addition to defect of cavity 63, it is assumed that component 92 is dropped down or operation of suction nozzle 134 is defective while suction nozzle 134 is moved from bulk feeder 50 to part camera 14. Therefore, determination section 42 may determine that cavity 63 is defective, for example, in a case where a predetermined consecutive number of mounting errors occurs in the collection operation of collecting components 92 from same cavity 63. In addition, in a case where the collection error occurs and in a case where it is recognized by re-image processing that the state in which component 92 is accommodated in cavity 63 in that state is maintained, determination section 42 may determine that cavity 63 is defective.

It should be noted that cavity information D2 updated as described above is used for extraction of the multiple addresses by operation control section 41 when the subsequent collection operations are executed. Specifically, operation control section 41 excludes component 92 accommodated in cavity 63 indicated as a defective state in cavity information D2 among multiple components 92 indicated as the collectable state in accommodation information D1, from the target of the collection operation.

As a result, for example, the collection operation in which cavity 63 into which component 92 is stuck is used as the target is not executed, so that the occurrence of collection errors can be prevented and the decrease in productivity can be prevented. In addition, determination section 42 may record the determination result in which cavity 63 is good in cavity information D2 in a case where cavity 63 is in the accommodation state "EMP" in the image processing after determining the defective state.

3-2-3. Notification Section 43

Control device 20 includes notification section 43 provided in mounting control unit 40 in the present embodiment. Notification section 43 notifies an operator of the defect of cavity 63 in a case where number Ms (see FIG. 8) of cavities 63 indicated as the defective state in cavity information D2 is equal to or larger than threshold value Th. As a result, the operator who receives the notification is urged to perform maintenance, such as removing fitted component 92 from cavity 63 of bulk feeder 50.

Figure 9:
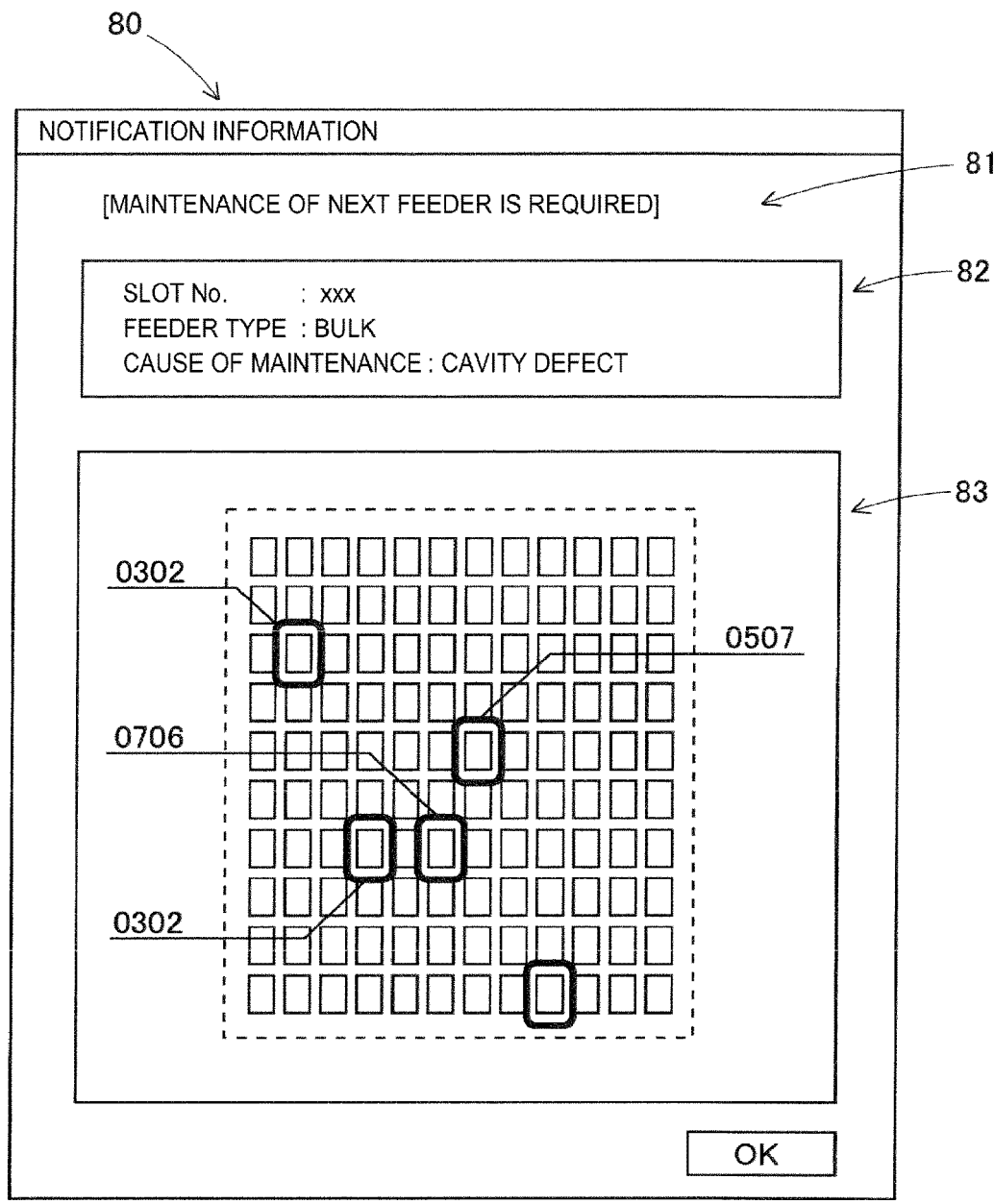
FIG. 9 is a view showing a notification screen.

In addition, in a case where the notification of the defect of cavity 63 is given, notification section 43 may also give a notification of various notification information as shown in FIG. 9. Specifically, notification section 43 may add message 81 including the purpose of notification to the operator to the notification information. In addition, in order to indicate the maintenance target among multiple feeders 122, notification section 43 may add target information 82 indicating a number of slot 121 to which bulk feeder 50 is set, the type of feeder, and the maintenance cause, to the notification information.

Further, notification section 43 may also give a notification of positional information 83 indicating the position of defective cavity 63 in supply region As based on cavity information D2. Specifically, the position of defective cavity 63 is surrounded by a frame in the image, and the corresponding address, the number of rows, or the number of columns is displayed as a character string. As a result, the operator can specify the position of bulk feeder 50 in which defective cavity 63 is generated, and can specify defective cavity 63 at an early stage. Therefore, it is possible to improve maintainability.

It should be noted that threshold value Th described above can be set optionally. Threshold value Th may simply be a number to be compared to the number of defective cavities 63. In addition, threshold value Th may be a number to be compared with the total of points weighted such that the degree of maintenance requirement is increased in accordance with the position of cavity 63 (for example, the number of rows). Further, threshold value Th may be set to be larger as the difference between the number of multiple cavities 63 and the maximum number of components 92 collected by the collection operation in one PP cycle is smaller.

4. Mounting Process by Component Mounter 10

Figure 10:
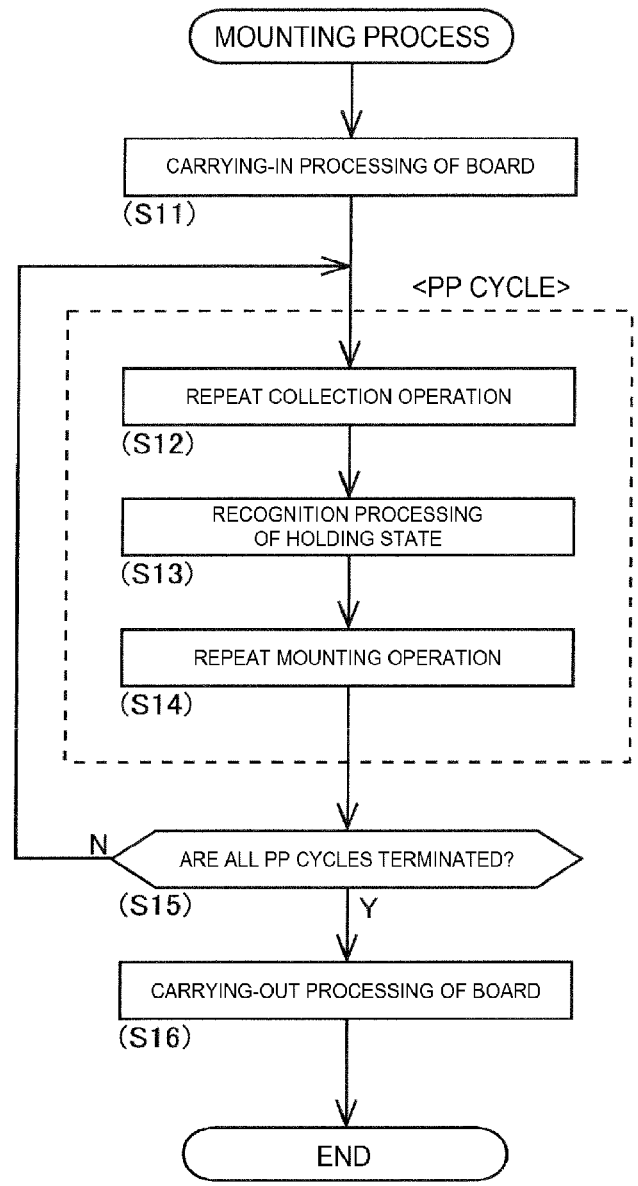
FIG. 10 is a flowchart showing a mounting process by the component mounter.
Figure 11:
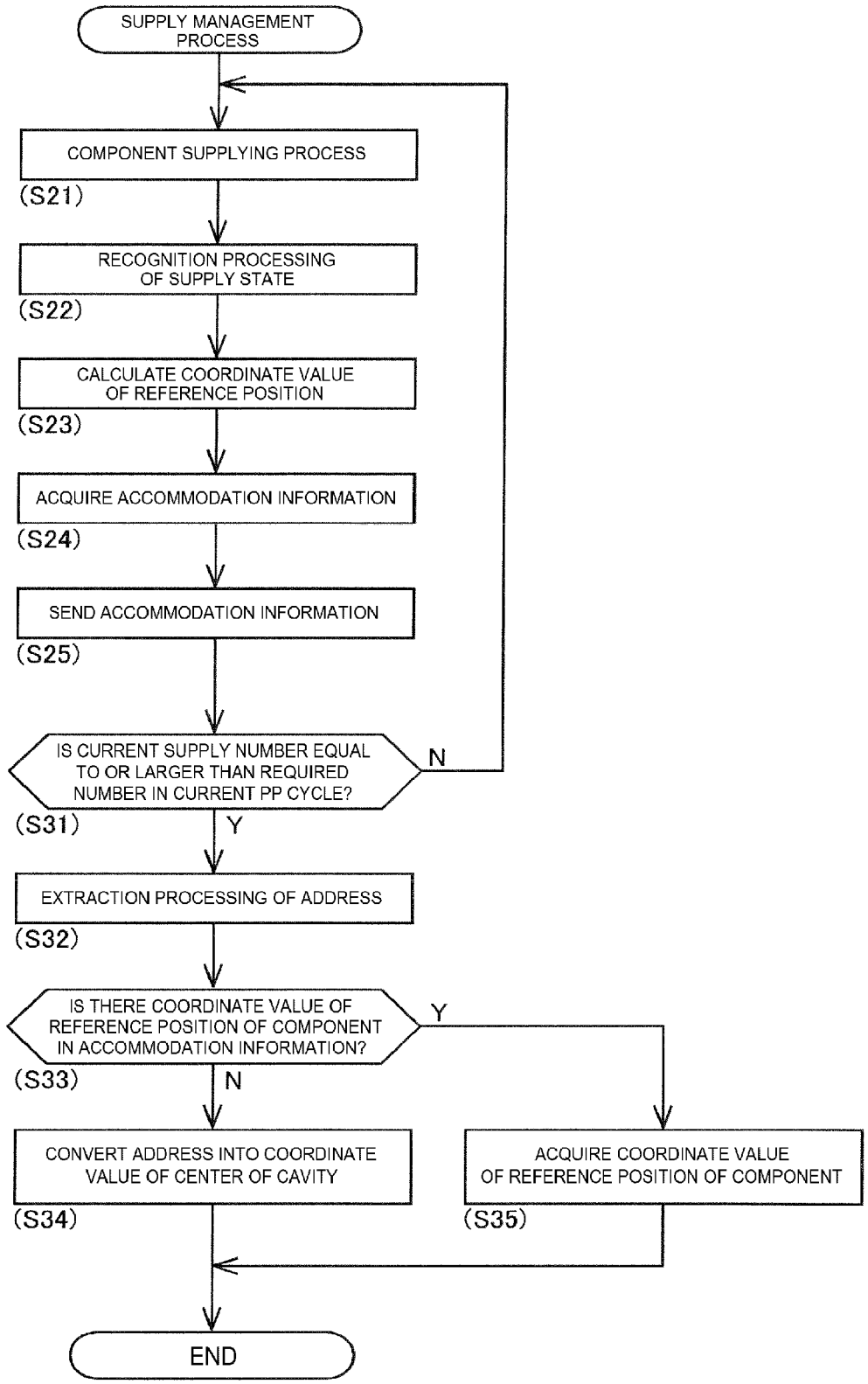
FIG. 11 is a flowchart showing a supply management process of the components by the component mounter.
Figure 12:
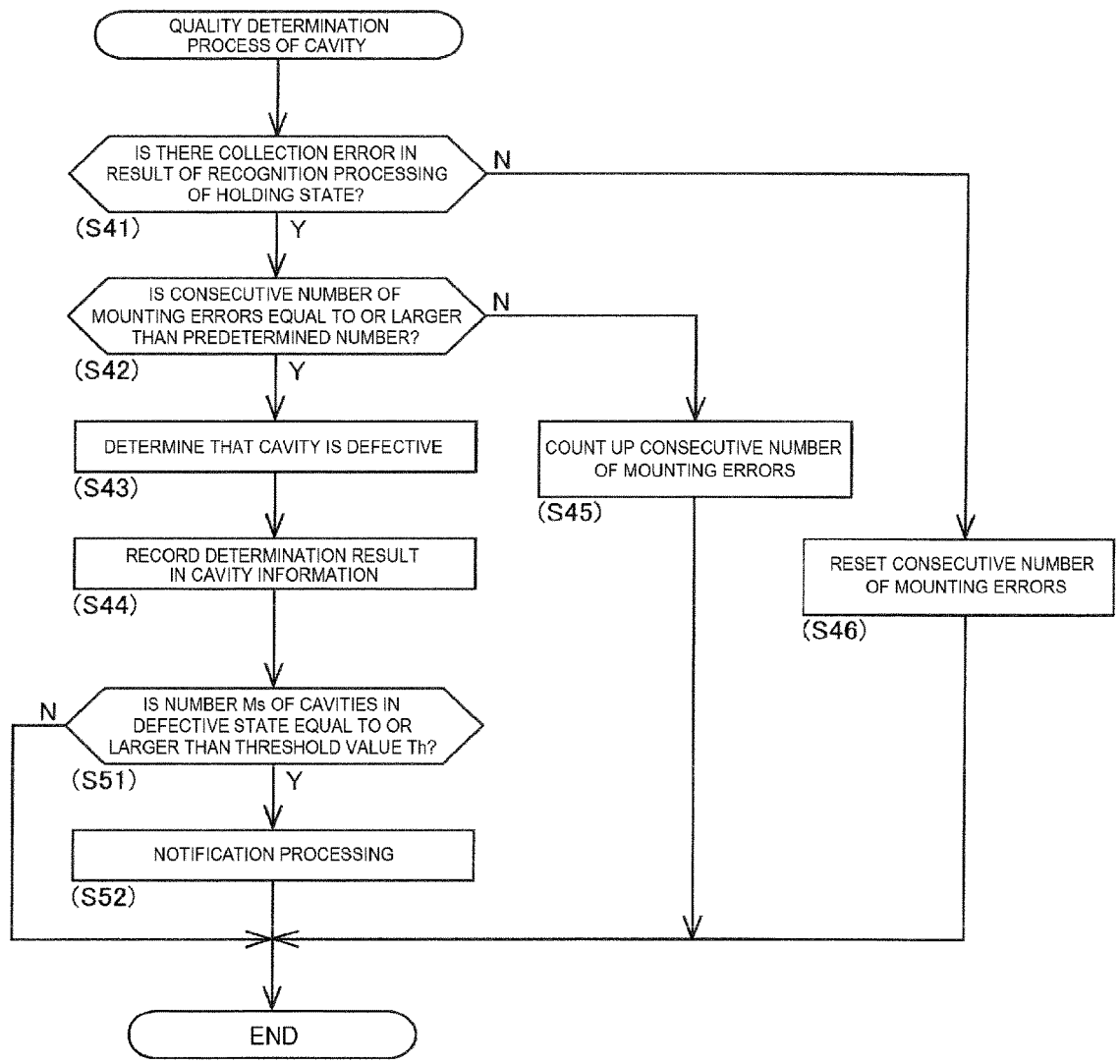
FIG. 12 is a flowchart showing a quality determination process of a cavity by the component mounter.

The mounting process by component mounter 10 will be described with reference to FIGS. 10 to 12. Here, a configuration is adopted in which bulk feeder 50 includes multiple cavities 63 in which multiple cavities 63 are formed in a matrix. In addition, after bulk feeder 50 described above is set in slot 121, control device 20 executes calibration processing and recognizes the positions of multiple cavities 63 in the machine.

In the calibration processing described above, control device 20 first moves board camera 15 above three reference marks 55 of bulk feeder 50, and acquires image data by imaging of board camera 15. Moreover, control device 20 recognizes the position of bulk feeder 50 in the machine based on the positions of three reference marks 55 included in the image data by image processing and the positions of board camera 15 when the image is captured. Control device 20 can acquire the coordinate values of individual cavities 63 based on a result of the calibration processing and arrangement information D3.

In the mounting process, first, board conveyance device 11 of component mounter 10 executes carrying-in processing of board 91 (S11). As a result, board 91 is carried in the machine and is positioned at a predetermined position in the machine. Control device 20 executes a supply management process including a component supplying process by bulk feeder 50 after S11 or in parallel with S11. By executing the component supplying process, multiple components 92 are accommodated in at least a part of multiple cavities 63 of bulk feeder 50. The details of the supply management process will be described below.

Next, control device 20 executes the PP cycle. In the PP cycle, operation control section 41 repeatedly executes the collection operation of collecting the components using multiple suction nozzles 134 (S12). In this case, operation control section 41 controls the operation of mounting head 133 in the collection operation to sequentially position mounting head 133 in accordance with the position of component 92 that can be collected. In this case, operation control section 41 appropriately switches the coordinate value of the center of cavity 63 or the coordinate value of the reference position of component 92 as the position of component 92 that can be collected, and positions suction nozzle 134.

Subsequently, control device 20 executes the recognition processing of the holding state of components 92 held by multiple suction nozzles 134 (S13). Specifically, control device 20 moves mounting head 133 above part camera 14 and sends an imaging command to part camera 14. Control device 20 executes the image processing on the image data acquired by the imaging of part camera 14 to recognize the posture (position and angle) of component 92 held by each of multiple suction nozzles 134. The result of the recognition processing of the holding state (S13) is recorded in storage section 21 as an operation result indicating whether the collection error occurs in the collection operation.

Thereafter, control device 20 repeatedly executes the mounting operation of mounting the components using multiple suction nozzles 134 (S14). It should be noted that in mounting operation (S14), control device 20 controls the operation of mounting head 133 to mount components 92 at the mounting positions designated by the control program. Further, mounting head 133 controls the operation of mounting head 133 such that suction nozzle 134 is positioned and angled with respect to the mounting position based on the result of the recognition processing (S13).

In addition, control device 20 causes bulk feeder 50 to execute the component supplying process in a period from termination of the collection operation (S12) of the current PP cycle described above to start of the collection operation (S12) of the next PP cycle. It should be noted that, in a case where the number (supply number) of components 92 that can be collected in current supply region As is equal to or larger than the required number of components 92 to be collected in the next PP cycle collection operation, the component supplying process described above may be omitted. Control device 20 determines whether all the PP cycles are terminated based on the control program (S15). In a case where all the PP cycles are not terminated (S15: No), the PP cycle (S12 to S14) is executed.

In a case where all the PP cycles are terminated (S15: Yes), control device 20 executes conveying-out processing of board 91 (S16). In the conveying-out processing of board 91, board conveyance device 11 unclamps positioned board 91 and carries board 91 out of the outside of component mounter 10.

5. Supply Management Process by Component Mounter 10

The supply management process by component mounter 10 will be described with reference to FIG. 11. The supply management process of component 92 is executed before the execution of the PP cycle or in parallel a part of the steps during the execution of the mounting process. First, control device 20 causes bulk feeder 50 to execute the component supplying process (S21). Bulk feeder 50 conveys, for example, component group Gp in the component supplying process, and accommodates components 92 in multiple cavities 63 to be collectable (see FIG. 4).

Next, image processing section 31 executes the recognition processing of the supply state in supply region As (S22). Specifically, control device 20 first moves board camera 15 above multiple cavities 63 in supply region As of bulk feeder 50, and acquires image data M1 by imaging of board camera 15. Moreover, image processing section 31 executes predetermined image processing on image data M1 to recognize components 92 accommodated in multiple cavities 63 (see FIG. 6).

Subsequently, image processing section 31 calculates coordinate value Ps of the reference position of component 92 (S23). It should be noted that, for example, in a case where it is not necessary to calculate coordinate value Ps of the reference position due to the setting, the calculation may be omitted. Image processing section 31 acquires accommodation information D1 in which the accommodation state for each of multiple cavities 63 and coordinate value Ps of the reference position of component 92 that can be collected are associated with the corresponding addresses (S24). Image processing section 31 sends accommodation information D1 described above to operation control section 41 of mounting control unit 40 (S25). In this case, image processing section 31 may send accommodation information D1 as it is, or may send accommodation information D1 (F11, F12, or the like) processed as needed.

Operation control section 41 determines whether the number (supply number) of components 92 that can be collected indicated in input accommodation information D1 is equal to or larger than the number of components 92 scheduled to be collected (required number) in the current PP cycle (S31). In this case, in a case where the supply number is calculated based on accommodation information D1, operation control section 41 does not calculate the supply number for the accommodation state "OK" in which the collection is possible, which is associated with the address corresponding to defective cavity 63 indicated by cavity information D2. It should be noted that, for example, in a case where supplied components 92 are collected by bulk feeder 50 by 20 suction nozzles 134 among 24 suction nozzles 134 in the collection operation of the current PP cycle, the number (required number) of components 92 scheduled to be collected is 20.

In a case where the supply number is less than the required number (S31: No), operation control section 41 causes bulk feeder 50 to execute the component supplying process (S21) again. As described above, operation control section 41 repeatedly executes the component supplying process (S21) or the like in a case where the required number of components 92 in the current PP cycle cannot be collected in the supply state of components 92 in current supply region As. It should be noted that, in a case where multiple numbers are required, the collection may be executed first by the current supply number of the required number, and then the component supplying process (S21) or the like may be executed to attempt the collection again.

On the other hand, in a case where the supply number is equal to or larger than the required number (S31: Yes), operation control section 41 executes extraction processing of the required number of addresses (S32). In the extraction processing (S32), as described above, operation control section 41 extracts the multiple addresses such that the required time for the collection operation over multiple times is shortened. It should be noted that the address corresponding to defective cavity 63 indicated in cavity information D2 is excluded from an extraction target.

Operation control section 41 determines whether accommodation information D1 includes coordinate value Ps of the reference position of component 92 (S33). In a case where accommodation information D1 does not include coordinate value Ps of the reference position (S33: No), operation control section 41 converts each of the extracted multiple addresses to the coordinate value based on coordinate data M2, that is, the coordinate value which is the center of corresponding cavity 63 (S34).

On the other hand, in a case where accommodation information D1 includes coordinate value Ps of the reference position (S33: Yes), operation control section 41 acquires coordinate value Ps of the reference position of component 92 accommodated in cavity 63 corresponding to each of the extracted multiple addresses (S35). As described above, operation control section 41 acquires the coordinate value for positioning suction nozzle 134 in the collection operation (S34, S35), and executes the step (S12) of repeating the collection operation in the PP cycle.

With the configuration described above, component mounter 10 can use the fact that bulk feeder 50 efficiently supplies the components by aligning components 92 in multiple cavities 63, and can use the addresses corresponding to multiple cavities 63 and the accommodation state associated with the address as the result information of the image processing. Therefore, it is possible to improve the usability and the manageability of the result information of the image processing of recognizing the components that can be collected.

6. Quality Determination Process of Cavity 63 and Notification Processing The quality determination process of cavity 63 and the notification processing by component mounter 10 will be described with reference to FIG. 12. The quality determination process of cavity 63 is executed in parallel with the steps after the step (S14) of repeating the mounting operation after the execution of the recognition processing of the holding state (S13) in the PP cycle, for example.

Determination section 42 inputs the result of the recognition processing of the holding state (S13), and determines whether the collection error occurs (S41). In a case where the collection error occurs (S41: Yes), determination section 42 determines the consecutive number of mounting errors reaches a predetermined number for cavity 63 accommodating component 92 that suction nozzle 134 that has caused the collection error attempts to collect (S42). In a case where the consecutive number of mounting errors is equal to or larger than the predetermined number (S42: Yes), determination section 42 determines that cavity 63 is defective (S43) and records the determination result in cavity information D2 (S44).

On the other hand, in a case where the consecutive number of mounting errors is less than the predetermined number (S42: No), determination section 42 counts up the consecutive number of collection errors in cavity 63 (S45). In addition, no collection error occurs in the step of repeating the collection operation (S12) (S41: No), determination section 42 determines that cavity 63 is good, and resets the consecutive number of mounting errors to 0 (S46). In addition, in a case where cavity 63 determined to be defective is in the accommodation state "EMP" in later accommodation information D1, determination section 42 records the determination result in which cavity 63 is good in cavity information D2.

Subsequently, determination section 42 determines whether number Ms of cavities 63 indicated as the defective state in cavity information D2 reaches threshold value Th (S51). In a case where number Ms of cavities 63 in the defective state is equal to or larger than threshold value Th (S51: Yes), notification section 43 executes the notification processing (S52). Specifically, notification section 43 displays various notification information (see FIG. 9). As a result, the operator is urged to perform maintenance on bulk feeder 50, and can efficiently perform maintenance with reference to the notification information. On the other hand, in a case where number Ms of cavities 63 in the defective state is less than threshold value Th (S51: No), the quality determination process of cavity 63 as described above is terminated.

7. Modification Aspect of Embodiment

In the embodiment, image processing unit 30 and mounting control unit 40 are configured on different boards. On the other hand, a configuration may be adopted in which image processing section 31 is provided in the same board as operation control section 41. It should be noted that, from the viewpoint of securing the expandability and maintainability of control device 20, the aspect described in the embodiment is preferable.

In the embodiment, the configuration has been adopted in which the camera that images supply region As of bulk feeder 50 is board camera 15. On the other hand, component mounter 10 may include a camera that is provided above bulk feeder 50 and can image supply region As. The camera may be dedicated to imaging of supply region As or may be used for other purposes. With such a configuration, the camera is a fixed type, and the accuracy of the calibration processing can be improved. It should be noted that, from the viewpoint of reducing facility cost, the aspect described in the embodiment is preferable.

In the embodiment, the configuration has been adopted in which the accommodation device is vibration device 71 that applies the vibration to track member 60. On the other hand, the accommodation device may adopt various aspects as long as it is possible to accommodate component 92 in the bulk state in multiple cavities 63 provided in track member 60. For example, the accommodation device may include a magnet provided to be movable along the conveyance path and may accommodate component 92 by guiding component 92 into cavity 63 by the magnetic force of the magnet. In addition, the accommodation device may accommodate component 92 in cavity 63 by tilting conveyance path R and sliding component 92 along conveyance path R.

REFERENCE SIGNS LIST

10: component mounter, 12: component supply device, 13: component transfer device, 133: mounting head, 134: suction nozzle, 14: part camera, 15: board camera, 20: control device, 21: storage section, 30: image processing unit, 31: image processing section, 40: mounting control unit, 41: operation control section, 42: determination section, 43: notification section, 50: bulk feeder, 51: feeder main body, 52: component case, 60: track member, 63: cavity, 71: vibration device (accommodation device), 80: notification screen, 81: message, 82: target information, 83: positional information, 91: board, 92: component, Gp: component group, Ar: reception region, D1, F11, F12: accommodation information (result of image processing), D2: cavity information, D3: arrangement information, M1: image data, M2: coordinate data, Th: threshold value, Ps: coordinate value (of reference position of accommodated component), Sr: defined range

The invention claimed is:

1. A component mounter to mount supplied components on a board, the component mounter comprising:
   a mounting head to mount the components;
   a bulk feeder including
      multiple cavities individually accommodating multiple components in a supply region in which the mounting head collects the components, and
      an accommodation device that accommodates the multiple components discharged from a component case accommodating the multiple components in a bulk state in at least a part of the cavities;
   a camera that images the supply region; and
   a control unit including:
      an image processing section that executes image processing on image data acquired by imaging of the camera to recognize an accommodation state of the component for each of the multiple cavities and acquire accommodation information in which the accommodation state of the component is associated with a unique address for each of the multiple cavities; and an operation control section that executes a collection operation of the component accommodated in the cavity based on the accommodation information.

2. The component mounter according to claim 1, wherein the control unit includes a determination section that determines quality of the cavity accommodating the component based on an operation result of whether the component is collected after the collection operation is executed.

3. The component mounter according to claim 2, wherein the operation control section uses the component indicated as a collectable state, in the accommodation information, in which the component is accommodated in the cavity in a normal posture, as a target of the collection operation, and the determination section determines that the cavity accommodating the component is defective in a case where the component is not collected and record a determination result in cavity information associated with the address.

4. The component mounter according to claim 3, wherein the operation control section excludes the component accommodated in the cavity indicated as a defective state in the cavity information among the multiple components indicated as the collectable state in the accommodation information, from the target of the collection operation.

5. The component mounter according to claim 3, wherein the control unit includes a notification section that notifies an operator that the cavity is defective in a case where the number of cavities indicated as a defective state in the cavity information is equal to or larger than a threshold value.

6. The component mounter according to claim 5, wherein the notification section also gives a notification of a position of a defective cavity in the supply region based on the cavity information in a case where a notification of a defect of the cavity is given.

7. The component mounter according to claim 1, wherein the accommodation state of the component indicated for each address in the accommodation information includes a collectable state in which the component is accommodated in the cavity in a normal posture, a non-collectable state in which the component has a non-collectable positional relationship with the cavity, and an empty state in which the component is not accommodated in the cavity.

8. The component mounter according to claim 1, wherein the operation control section is acquires the accommodation information by direct or indirect communication with the image processing section and execute the collection operation based on coordinate data indicating a coordinate value for each of the multiple cavities corresponding to the address and the accommodation information.

9. The component mounter according to claim 8, wherein the image processing section transmits the accommodation information in which the accommodation state is associated only with the address of the cavity in a collectable state in which the component is accommodated in the cavity in a normal posture in a result of the image processing, to the operation control section.

10. The component mounter according to claim 8, wherein multiple addresses have consecutiveness relating to arrangement of the multiple cavities, and the image processing section transmits the accommodation information in which the accommodation state associated with each of the consecutive addresses is encoded by run-length compression, to the operation control section.

11. The component mounter according to claim 1, wherein the image processing section recognizes the accommodation state of the component for each of the multiple cavities and calculate a coordinate value of a reference position of a collectable component accommodated in the cavity in a normal posture among the multiple components in the image processing to acquire the accommodation information in which the coordinate value of the reference position is associated with the address.

12. The component mounter according to claim 11, wherein the operation control section executes the collection operation based on the accommodation state of the component and the coordinate value of the reference position in a case where the coordinate value of the reference position of the component is indicated in the accommodation information.

13. The component mounter according to claim 11, wherein the image processing section switches whether to calculate the coordinate value of the reference position of the component in accordance with a type of the component in the image processing.

14. The component mounter according to claim 1, wherein the image processing section sets a target range of the image processing only within a defined range for each of the multiple cavities based on arrangement information indicating positions of the multiple cavities in the bulk feeder.

* * * * *